(12) United States Patent
Saido

(10) Patent No.: US 11,384,434 B2
(45) Date of Patent: Jul. 12, 2022

(54) SUBSTRATE PROCESSING APPARATUS AND HEATER DEVICE

(71) Applicant: KOKUSAI ELECTRIC CORPORATION, Tokyo (JP)

(72) Inventor: Shuhei Saido, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/646,993

(22) PCT Filed: Sep. 13, 2017

(86) PCT No.: PCT/JP2017/033045
§ 371 (c)(1),
(2) Date: Mar. 12, 2020

(87) PCT Pub. No.: WO2019/053807
PCT Pub. Date: Mar. 21, 2019

(65) Prior Publication Data
US 2020/0216958 A1    Jul. 9, 2020

(51) Int. Cl.
| | |
|---|---|
| C23C 16/46 | (2006.01) |
| C23C 16/34 | (2006.01) |
| C23C 16/44 | (2006.01) |
| C23C 16/455 | (2006.01) |
| C23C 16/458 | (2006.01) |
| H05B 1/02 | (2006.01) |

(52) U.S. Cl.
CPC ............ *C23C 16/46* (2013.01); *C23C 16/345* (2013.01); *C23C 16/4408* (2013.01); *C23C 16/4587* (2013.01); *C23C 16/45563* (2013.01); *H05B 1/0233* (2013.01)

(58) Field of Classification Search
CPC ............ C23C 16/4584; C23C 16/4408; C23C 16/4409; C23C 16/45578
See application file for complete search history.

(56) References Cited

U.S. PATENT DOCUMENTS

| | | | | |
|---|---|---|---|---|
| 2008/0023141 | A1* | 1/2008 | Shimizu | C23C 16/4584 156/345.29 |
| 2017/0037512 | A1* | 2/2017 | Saido | C23C 16/4408 |

* cited by examiner

*Primary Examiner* — Joseph A Miller, Jr.
(74) *Attorney, Agent, or Firm* — Volpe Koenig

(57) ABSTRACT

A substrate processing apparatus for preventing adhesion of by-products to an inner surface of a furnace opening is disclosed. An apparatus is provided with: a process chamber, a substrate holder, a process gas supplier that supplies a process gas into the process chamber, a first heater that is installed outside the process chamber and heats an inside of the process chamber, a heat insulator that is installed between a lid of the process chamber and the substrate holder, a second heater that is installed near the substrate holder in the heat insulator and heats the inside of the process chamber, a third heater that is installed near an end closer to the lid in the process chamber and heats the end, and a supplier that supplies a purge gas to purge around the second and third heaters into the heat insulator.

9 Claims, 7 Drawing Sheets

SUBSTRATE PROCESSING APPARATUS AND HEATER DEVICE

CROSS-REFERENCE TO RELATED PATENT APPLICATION

This non-provisional U.S. patent application claims priority under 35 U.S.C. § 119 of International Application No. PCT/JP2017/033045, filed on Sep. 13, 2017, in the WIPO, the entire contents of which are hereby incorporated by reference.

BACKGROUND

1. Technical Field

This present disclosure relates to a substrate processing apparatus and a heater device.

2. Description of the Related Art

In heat treatment of a substrate (wafer) at a manufacturing step of a semiconductor device (device), for example, a vertical substrate processing apparatus is used. In the vertical substrate processing apparatus, a plurality of substrates is arranged in a vertical direction by a substrate holder, and the substrate holder is loaded into a processing chamber. Thereafter, a process gas is introduced into the processing chamber in a state in which the substrate is heated by a heater installed outside the processing chamber, and a thin film forming process and the like is performed on the substrate.

SUMMARY

In a conventional vertical substrate processing apparatus, heat easily escapes from a furnace opening lid member or the like which closes a furnace opening below the processing chamber. Therefore, in particular, when temperature of a substrate located near the furnace opening of the processing chamber is elevated to processing temperature, it might take a long heatup time. There also is a problem that by-products derived from the process gas adhere to an inner surface of a low-temperature furnace opening, thereby causing particles and the like.

An object of this present disclosure is to provide a technology capable of shortening the heatup time in the processing chamber and preventing the adhesion of the by-products.

According to one aspect of this present disclosure,
a technology provided with:
a process chamber in which a substrate is processed;
a substrate holder that holds the substrate in the process chamber;
a process gas supplier that supplies a process gas into the process chamber;
a first heater that is installed outside the process chamber and heats an inside of the process chamber;
a heat insulator that is installed below the substrate holder;
a second heater that is installed near the substrate holder in the heat insulator and heats the inside of the process chamber;
a third heater that is installed near an end closer to the lid in the process chamber and heats the end; and
a purge gas supplier that supplies a purge gas into the heat insulator to purge around the second and third heaters
is provided.

DETAILED DESCRIPTION

Hereinafter, an embodiment is described with reference to the drawings.

Figure 1:
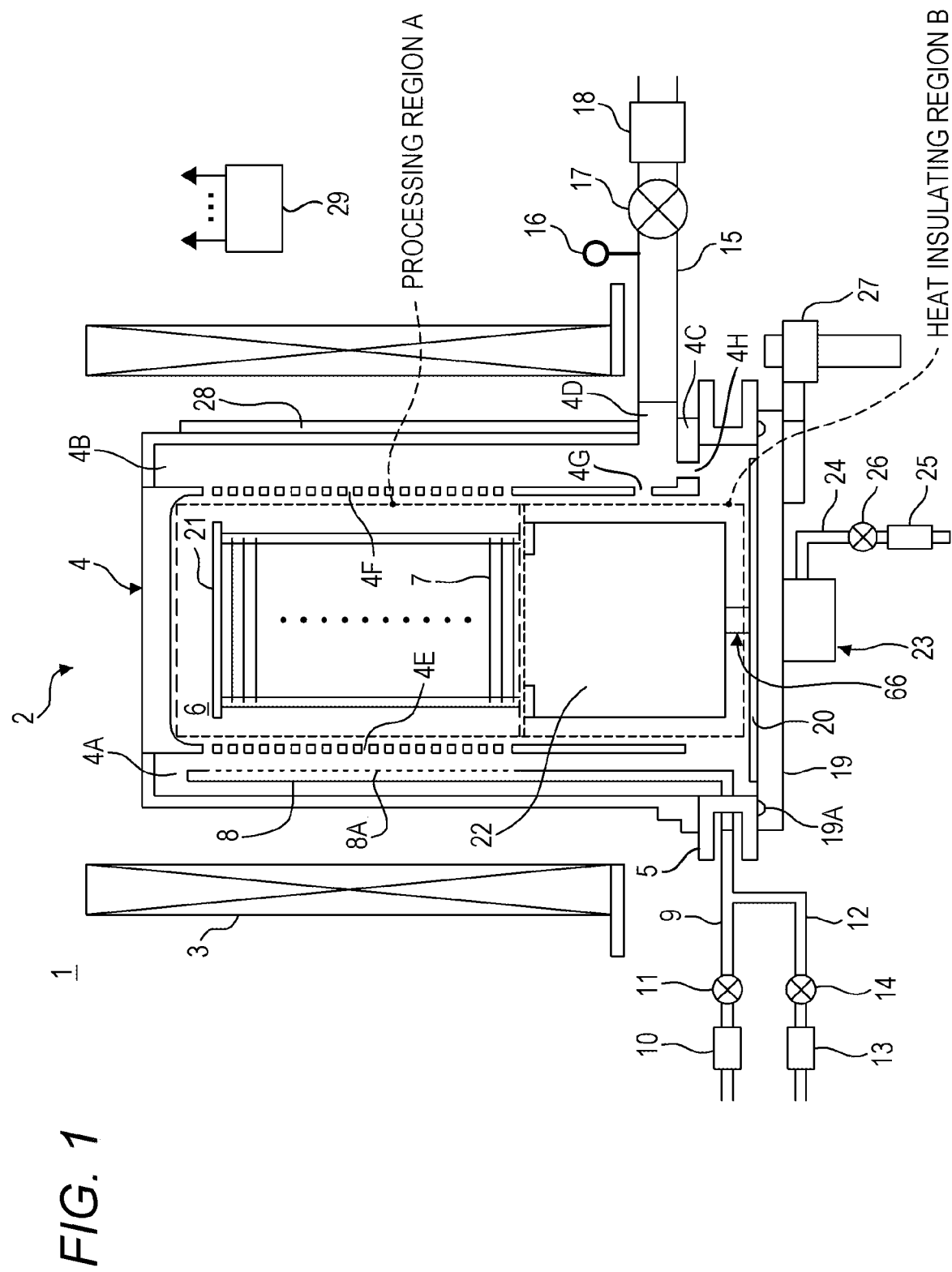
FIG. 1 is a schematic diagram of a substrate processing apparatus according to an embodiment.

As illustrated in FIG. 1, a substrate processing apparatus 1 of the embodiment is formed as a vertical heat treatment apparatus which performs a heat treatment process when manufacturing a semiconductor integrated circuit and is provided with a processing furnace 2. The processing furnace 2 includes a heater 3 formed of a plurality of heater units for heating a processing furnace 2 uniformly. The heater 3 has a cylindrical shape and is supported by a heater base (not illustrated) as a holding plate, thereby being installed perpendicularly to an installation floor of the substrate processing apparatus 1. As described later, the heater 3 also serves as an activation mechanism (exciter) which activates (excites) gas with heat.

A reaction tube 4 forming a reaction vessel (process chamber) is arranged inside the heater 3. The reaction tube 4 is formed of a heat-resistant material such as quartz ($SiO_2$) or silicon carbide (SiC), for example, and is formed into a cylindrical shape with an upper end closed and a lower end opened. Outside the reaction tube 4, a gas supply space (supply duct) 4A and a gas exhaust space (exhaust duct) 4B are formed to protrude outward so as to face each other. A flange 4C protruding outward is formed on the lower end of the reaction tube 4. An entire reaction tube 4 including them is integrally formed of a single material.

A process chamber 6 is formed in a hollow portion of the reaction tube 4. The process chamber 6 is formed to be able to accommodate a wafer 7 by a boat 21 described later. The process chamber 6 is separated from a gas supply space 6A and a gas exhaust space 6B by the reaction tube 4 (inner wall). That is, an inner surface of the process chamber 6 is maintained in a cylindrical shape.

A manifold 5 is formed of metal into a cylindrical shape and is provided so as to support the lower end of the reaction tube 4. An inner diameter of the manifold 5 is formed to be larger than an inner diameter of the reaction tube 4 (inner diameter of the flange 4C). As a result, an annular space described later may be formed between the lower end of the reaction tube 4 (flange 4C) and a seal cap 19 described later.

One or more nozzles 8 are provided in the gas supply space 4A. A gas supply pipe 9 for supplying a process gas (source gas) is connected to the nozzle 8 through the manifold 5. On a flow path of each gas supply pipe 9, a mass flow controller (MFC) 10 as a flow rate controller and a valve 11 as an on-off valve are provided in this order from an upstream side. A gas supply pipe 12 for supplying an inert gas is connected to the gas supply pipe 9 on a downstream side of the valve 11. The gas supply pipe 12 is provided with an MFC 13 and a valve 14 in this order from an upstream side. A process gas supplier which is a process gas supply system is mainly formed of the gas supply pipe 9, the MFC 10, and the valve 11.

The nozzle 8 is provided in the gas supply space 4A so as to rise from a lower part of the reaction tube 4. One or a plurality of gas supply holes 8C for supplying the gas is provided on a side surface and an upper end of the nozzle 8. The gas supply hole opening to face the center of the reaction tube 4 may inject the gas toward the wafer 7. On the inner wall between the gas supply space 4A and the process chamber 6, horizontally long supply slits 4E are provided in a plurality of stages in a vertical direction at intervals corresponding to the wafers 7.

On the inner wall between the gas exhaust space 4B and the process chamber 6, horizontally long exhaust slits 4F as first exhausters (first exhaust ports) are provided in a plurality of stages in the vertical direction so as to correspond to the supply slits 4E. An exhaust port 4D communicating with the gas exhaust space 4B is formed in the vicinity of the lower end of the reaction tube 4. An exhaust pipe 15 which exhausts an atmosphere in the process chamber 6 is connected to the exhaust port 4D. An exhaust port 4G is formed on the inner wall on a lower portion of the gas exhaust space 4B (the wall between the gas exhaust space 4B and the process chamber 6). On the flange 4C also, an exhaust port 4H which allows the process chamber 6 and the lower end of the gas exhaust space 4B to communicate with each other is formed. The exhaust ports 4G and 4H mainly serve to exhaust a purge gas described later.

A vacuum pump 18 as a vacuum exhaust device is connected to the exhaust pipe 15 through a pressure sensor 16 as a pressure detector (pressure gauge) for detecting a pressure in the process chamber 6 and an auto pressure controller (APC) valve 17 as a pressure regulator (pressure regulator). The APC valve 17 may perform and stop vacuum exhaust in the process chamber 6 by opening and closing the valve in a state in which the vacuum pump 18 is operated. Furthermore, it is configured such that the pressure in the process chamber 6 may be adjusted by adjusting a degree of valve opening based on pressure information detected by the pressure sensor 16 in a state in which the vacuum pump 18 operated. An exhaust system is mainly formed of the exhaust pipe 15, the APC valve 17, and the pressure sensor 16. The vacuum pump 18 may be included in the exhaust system.

Below the manifold 5, the seal cap 19 is provided as a furnace opening lid member which may airtightly close a lower end opening of the manifold 5. The seal cap 19 is formed of metal such as stainless steel or a nickel-based alloy, for example, into a disk shape. On an upper surface of the seal cap 19, an O-ring 19A as a seal member which abuts the lower end of the manifold 5 is provided.

A cover plate 20 which protects the seal cap 19 is installed on the upper surface of the seal cap 19 inside a bottom flange of the manifold 5. The cover plate 20 is formed of a heat and corrosion resistant material such as quartz, sapphire, or SiC, for example, into a disk shape. Since the cover plate 20 does not require mechanical strength, this may be formed to have a small thickness. The cover plate 20 is not limited to a component prepared independently of the seal cap 19, and may be a thin film or layer of nitride or the like coated on an inner surface of the seal cap 19 or obtained by modifying the inner surface. The cover plate 20 may also have a wall which rises from a circumferential edge along an inner surface of the manifold 5.

The boat 21 as a substrate holder supports a plurality of, for example, 25 to 200 wafers 7 in a plurality of stages by aligning them in the vertical direction in a horizontal attitude and with their centers aligned. There, the wafers 7 are arranged at regular intervals. The boat 21 is made of a heat resistant material such as quartz or SiC, for example. There is a case where the reaction tube 4 desirably has a minimum inner diameter which allows the boat 21 to be safely loaded into and unloaded from the same.

A heat insulating assembly 22 as a heat insulator is arranged under the boat 21. The heat insulating assembly 22 has such a structure that heat conduction or heat transmission in the vertical direction decreases, and usually has a cavity inside. The inside may be purged with the purge gas.

A rotation mechanism 23 which rotates the boat 21 is installed on a side opposite to the process chamber 6 of the seal cap 19. A gas supply pipe 24 for the purge gas is connected to the rotation mechanism 23. The gas supply pipe 24 is provided with an MFC 25 and a valve 26 in this order from the upstream side, and a purge gas supplier is mainly formed of them. One purpose of the purge gas is to protect the inside (for example, a bearing) of the rotation mechanism 23 from a corrosive gas used in the process chamber 6. The purge gas is exhausted along a shaft from the rotation mechanism 23 to be guided into the heat insulating assembly 22.

A boat elevator 27 is provided vertically below the outside of the reaction tube 4 and operates as an elevating mechanism (transfer mechanism) which lifts up and down the seal cap 19. As a result, the boat 21 and the wafer 7 supported by the seal cap 19 are loaded into and unloaded from the process chamber 6.

A temperature detector 28 is installed on an outer wall of the reaction tube 4. The temperature detector 28 may be formed of a plurality of thermocouples vertically arranged side by side. By adjusting a degree of energization to the heater 3 based on temperature information detected by the temperature detector 28, temperature in the process chamber 6 has desired temperature distribution.

A controller 29 is a computer which controls the entire substrate processing apparatus 1, and is electrically connected to the MFCs 10 and 13, the valves 11 and 14, the pressure sensor 16, the APC valve 17, the vacuum pump 18, the heater 3, an upper cap heater 34, a lower cap heater 35, the temperature detector 28, the rotation mechanism 23, the boat elevator 27 and the like to receive signals from them and control them.

Figure 2:
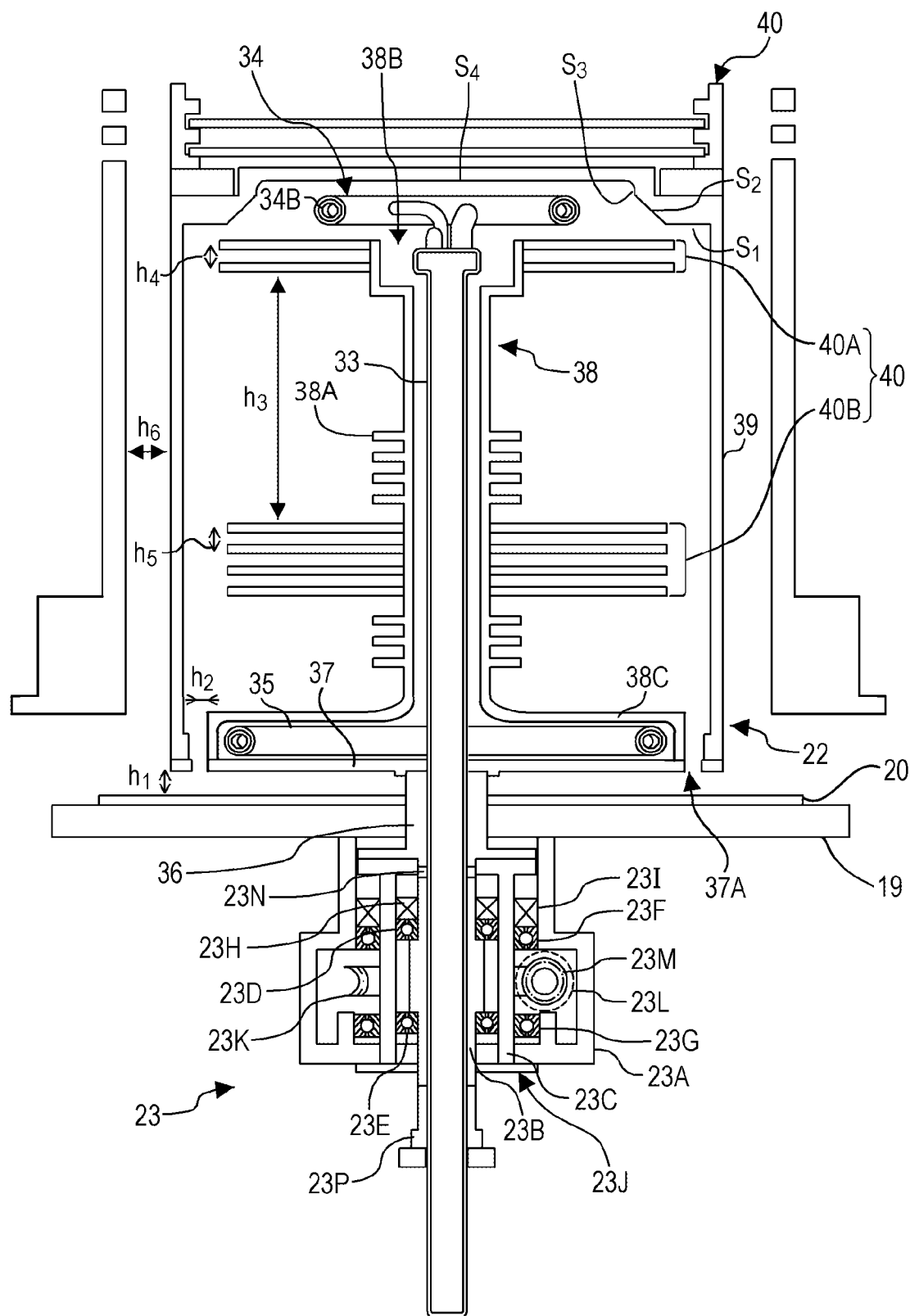
FIG. 2 is a longitudinal section of a heat insulating assembly in the substrate processing apparatus of the embodiment.

FIG. 2 illustrates a cross-section of the heat insulating assembly 22 and the rotation mechanism 23. The rotation mechanism 23 is provided with a casing (body) 23A formed into a substantially cylindrical shape with an upper end opened and a lower end closed, and the casing 23A is fixed to a lower surface of the seal cap 19 with a bolt. Inside the casing 23A, a cylindrical inner shaft 23B and an outer shaft 23C formed into a cylindrical shape having a diameter larger than a diameter of the inner shaft 23B are provided coaxially in this order from an inner side. The outer shaft 23C is rotatably supported by a pair of upper and lower inner bearings 23D and 23E interposed between the same and the inner shaft 23B and a pair of upper and lower outer bearings 23F and 23G interposed between the same and the casing 23A. In contrast, the inner shaft 23B is fixed to the casing 23A and cannot rotate.

Above the inner bearing 23D and the outer bearing 23F, that is, on a side of the process chamber 6, magnetic fluid seals 23H and 23I are installed to separate vacuum and atmospheric pressure air. The outer shaft 23C is mounted with a worm wheel or a pulley 23K driven by an electric motor (not illustrated) or the like.

Inside the inner shaft 23B, a sub-heater supporting column 33 as a first auxiliary heating mechanism for heating the wafer 7 from below in the process chamber 6 is vertically inserted. The sub-heater supporting column 33 being a pipe made of quartz holds the upper cap heater 34 concentrically at an upper end thereof and holds the lower cap heater 35 concentrically in a middle portion thereof. The sub-heater supporting column 33 is supported by a supporter 23N formed of a heat-resistant resin at an upper end position of the inner shaft 23B. Further below, the sub-heater supporting column 33 is such that a space between an outer surface thereof and the inner shaft 23B is sealed via an O ring by a vacuum joint 23P connected to the inner shaft 23B or the casing 23A.

The upper cap heater 34 and the lower cap heater 35 are formed into torus or ring shapes having diameters smaller than those of the wafer 7 and a cylindrical portion 39, and are connected to be supported by the sub-heater supporting column 33 so as to be parallel to the wafer 7. Inside them, heater element wires forming heating elements 34C and 35C which are coiled resistance heating elements are inserted, respectively. The heating elements 34C and 35C are made of, for example, an Fe—Cr—Al alloy, molybdenum disilicide, tungsten or the like.

Casings of the upper cap heater 34 and the lower cap heater 35 are pipes made of quartz and may be formed integrally with or independently from the sub-heater supporting column 33. The upper cap heater 34 and the lower cap heater 35 formed independently may be connected to the sub-heater supporting column 33 by a socket which is electrically and mechanically coupled. In a case where both the upper cap heater 34 and lower cap heater 35 are configured so as not to be attachable/detachable, it is necessary to make a heat insulator holder 38 have a structure divided in half and to provide a fixing tool for coupling them together.

A cylindrical rotary shaft 36 having a flange at a lower end is fixed to an upper surface of the outer shaft 23C formed into a flange shape. The sub-heater supporting column 33 penetrates a cavity of the rotary shaft 36. At an upper end of the rotary shaft 36, a disk-shaped rotating table 37 with a through-hole through which the sub-heater supporting column 33 penetrates formed at the center is fixed with a predetermined interval of $h_1$ from the cover plate 20. $h_1$ is preferably set to 2 to 10 mm. If $h_1$ is smaller than 2 mm, there is a case where the members come into contact with each other during boat rotation, or a purge gas flow rate in a cylindrical portion 39 described later decreases due to a decrease in conductance. If $h_1$ is larger than 10 mm, there is a case where a large amount of process gas enters the cylindrical portion 39, or the reactive gas and the like diffuses in the cylindrical portion 39 due to a decrease in flow velocity.

The rotating table 37 is made of metal such as stainless steel, for example. On an upper surface of the rotating table 37, the heat insulator holder 38 for holding a heat insulator 40 and the cylindrical portion 39 are placed concentrically to be fixed by a screw or the like. The heat insulating assembly 22 includes the rotating table 37, the heat insulator holder 38, the cylindrical portion 39, and the heat insulator 40, and the rotating table 37 forms a bottom plate (cradle). They may be made of a heat-resistant material such as transparent quartz except the rotating table 37. On the rotating table 37, a plurality of exhaust holes 37A having a diameter (width) of $h_2$ is formed in a rotationally symmetrical manner near an edge. $h_2$ is preferably set to 10 mm or larger.

The heat insulator holder 38 is formed into a cylindrical shape having a cavity through which the sub-heater supporting column 33 penetrates in the center. At a lower end of the heat insulator holder 38, there is an outward flange-shaped foot 38C having an outer diameter smaller than that of the rotating table 37. The foot 38C spreads from the cylindrical portion into a disk shape to be formed into a short cylinder. Since the foot 38C abuts the rotating table at a tip end thereof, a disk-shaped space is formed between the rotating table 37 and the holder 38. The lower cap heater 35 is accommodated in this space. In contrast, an upper end of the heat insulator holder 38 is opened so that the sub-heater supporting column 33 protrudes therefrom to form a purge gas supply port 38B. By making the supply port 38B an annular opening, the purge gas may be supplied uniformly on an upper end of the cylindrical portion 39 and in an entire circumferential direction in a radial direction of an annular plane. By increasing a diameter in the vicinity of the opening, that is, by making a diameter of the supply port 38B larger than a diameter of a column portion, the purge gas may be supplied smoothly in all directions in an upper portion in the cylindrical portion 39. A flow of the purge gas at that time is preferably a constant laminar flow.

A diameter of the cavity of the cylindrical portion of the heat insulator holder 38 is made larger than an outer diameter of the sub-heater supporting column 33; with such a configuration, a first flow path having an annular cross-section may be formed as a purge gas supply path for supplying the purge gas to an upper portion in the heat insulating assembly 22 between the heat insulator holder 38 and the sub-heater supporting column 33.

The purge gas supplied from the supply port 38B flows downward through a second flow path which is a space between the heat insulator holder 38 and the inner wall of the cylindrical portion 39 to be exhausted out of the cylindrical portion 39 from the exhaust hole 37A.

A plurality of reflecting plates 40A and a plurality of heat insulating plates 40B are installed coaxially as the heat insulator 40 on the column of the heat insulator holder 38. Flange-shaped holding shelfs 38A are formed on the holder 38 above and below the heat insulating plate 40B so that the heat insulating plate 40B may be added. The reflecting plates 40A and the heat insulating plates 40B are arranged at a predetermined interval of $h_3$. $h_3$ is preferably set to 100 to 300 mm.

The reflecting plate 40A having a disk shape with a diameter smaller than the diameter of the wafer 7 is formed of, for example, silicon or opaque quartz and is held on the upper holding shelf 38A at a predetermined interval of $h_4$. $h_4$ is preferably set to 2 to 15 mm. If $h_4$ is smaller than 2 mm, there is a case where the gas stays between the reflecting plates 40A. The reflecting plate 40A serves to enclose the heat above the reflecting plate 40A in situ such that a difference in temperature gradient in the vertical direction in the heat insulating assembly 22 does not occur as long as possible due to presence of heating by the upper portion cap heater 34 and to planarize in-surface temperature distribution of the wafer 7 placed on a lowest stage of the boat 21.

The heat insulating plate 40B having a disk shape with a diameter smaller than the diameter of the wafer 7 is preferably formed of a material having a small heat capacity, small heat transfer, and a high reflectance in a far infrared region; for example, this is formed of transparent quartz, SiC or the like. The heat insulating plate 40B may also be realized by coating a disk-shaped base material having a sufficiently small surface roughness with a corrosion-resistant substance having a reflectance lower than that of the base material. Herein, four heat insulating plates 40B are held at a predetermined interval of $h_5$ on the lower holding shelf 38A. As with $h_4$, $h_5$ is preferably set to 2 mm or larger.

In this example, the number of heat insulating plates 40B is set to be equal to or larger than the number of reflecting plates 40A. In this manner, by installing the reflecting plates 40A on the upper side and the heat insulating plates 40B on the lower side, radiant heat from a sub-heater 64 is reflected by the reflecting plate 40A, and radiant heat from the heater 34 and the sub-heater 64 is insulated by the heat insulating plate 40B away from the wafer 7, so that temperature responsiveness of the wafer 7 may be improved, and a heatup time may be shortened. Note that, the number and arrangement of the reflecting plates 40A and the heat insulating plates 40B are not limited to those described above, and may be optimized so as to minimize a thermal flux passing through the heat insulating assembly 22.

A distance $h_6$ between the inner wall of the reaction tube 4 and the wall of the cylindrical portion 39 is desirably set to be small in order to suppress the process gas from entering the quartz cylinder and reduce an outflow to the process chamber 6; this is preferably set to 7.5 mm to 15 mm, for example.

The upper end of the cylindrical portion 39 is closed with a flat plate, and the boat 21 is installed there. The upper end of the cylindrical portion 39 is formed into a convex shape. In other words, a step is formed on an entire outer periphery of an upper surface of the cylindrical portion 39, and a ring-shaped bottom plate of the boat 21 is fitted to this step. With such a configuration, it becomes possible to rotate the cylindrical portion 39 and the boat 21 without rotating the sub-heater 64.

A height of the step on the upper surface of the cylindrical portion 39 is formed to be substantially the same as a thickness of the bottom plate of the boat 21, and when the boat 21 is placed, the bottom plate of the boat 21 and the top surface of the cylindrical portion 39 flush with each other. With such a configuration, the flow of the process gas may be improved, and film forming uniformity in a bottom region may be improved.

Herein, a characteristic action of the sub-heater in this example is described. The upper cap heater 34 and the lower cap heater 35 have independent lead wires and may be energized independently. The upper cap heater 34 is arranged in the vicinity of the upper end in the cylindrical portion 39 and heats the upper surface of the cylindrical portion 39 and the reflecting plate 40A around the same, and the wafer 7 at the lowest stage of the boat 21. By heating in this manner in a temperature elevating process, it is possible to approximate to the temperature distribution (temperature gradient distribution) in a temperature stable state. Also in the temperature stable state, it is possible to heat to compensate for heat escape, and temperature uniformity among the wafers 7 or temperature uniformity in the lowermost stage wafer 7 may be improved.

The lower cap heater 35 may heat members such as the rotating table 37 around the same, and is particularly intended to heat the inner surface of the manifold 5. The lower cap heater 35 is provided in a position substantially at the same height as the manifold 5 and facing the inner surface of the manifold 5, and may be heated by infrared rays transmitted through a casing of the lower cap heater 35 itself and a foot 39C of the cylindrical portion. A transmission band of transparent quartz extends up to around 5 μm and transmits almost entire infrared rays with a wavelength of 3 μm or lower, so that a part of radiant energy from a heat source at 300° C. or higher may be transmitted.

The O-ring 19A is made of fluoro-rubber and the like having heat resistant temperature of about 300° C., which is one reason that the temperature at the furnace opening cannot be elevated. In general, the flange of the manifold 5 or the reaction tube 4 is water-cooled so that temperature of a site abutting the O-ring 19A of the manifold 5 does not exceed predetermined temperature (for example, 250 to 280° C.). Being the coldest site in the reaction tube 4, at the furnace opening, a phenomenon different from that in a processing region such as adhesion of by-products and agglomeration of the source gas is likely to occur. Ideally, the temperature at the furnace opening is maintained within an optimum range (for example, 180 to 260° C.) For this purpose, it might be necessary sometimes to heat the furnace opening. However, it is difficult to allow a jacket heater covered from the outside to be in uniform contact with an inlet, so that sufficient heating efficiency cannot be obtained, and uniform heating is difficult.

The lower cap heater 35 heats the inner surface of the manifold 5 where the by-products are likely to adhere, so that the temperature of the inner surface may be elevated more efficiently and uniformly than when the jacket heater is wound around an outer periphery of the manifold 5. Since the controlled lower cap heater independent of the upper cap heater 34 may heat not only the manifold 5 but also the periphery of the furnace opening at a high speed, it is possible to shorten a time required for temperature stabilization of the relevant part. Furthermore, it is also possible to locally heat the vicinity of the furnace opening to high temperature equal to or higher than processing temperature. By doing so, it becomes possible to heat the source gas supplied from the inlet around the furnace opening, which is particularly effective when the flow rate is increased.

Figure 3:
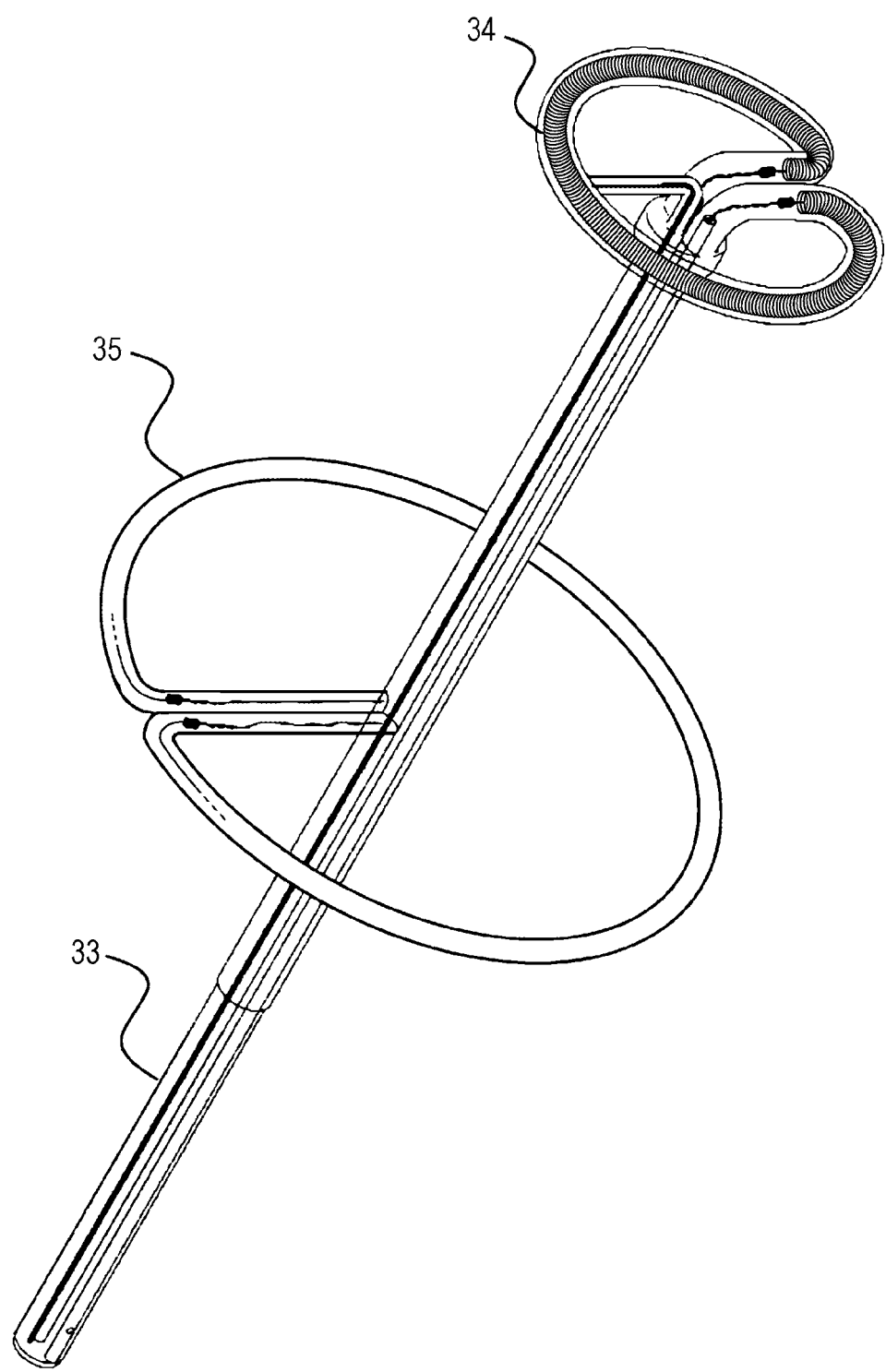
FIG. 3 is a perspective view of an upper cap heater and a lower cap heater in the substrate processing apparatus of the embodiment.

FIG. 3 illustrates the upper cap heater 34 and the lower cap heater 35 integrally formed. The diameter of the torus of the upper cap heater 34 is set to approximately half the diameter of the wafer 7, and the diameter of the torus of the lower cap heater 35 is set to be as large as possible within a range not in contact with the inside of the foot 38C of the heat insulator holder and accommodated therein. That is, the nearer the lower cap heater to the inlet, the more efficiently this may be heated. Therefore, it is desirable to arrange the same on the outer peripheral side as much as possible in the cylindrical portion 39. As a result, the lower cap heater is formed to have a larger diameter than that of the upper cap heater.

The lower cap heater 35 may be manufactured as follows. That is, lead wires having a length sufficient to be taken out from the sub-heater supporting column 33 are connected to both ends of a filament having a length corresponding to a length of an annular portion. Next, the filament is allowed to pass through a linear quartz tube, the straight tube is crushed to be closed by fire processing near both the ends of the filament, and the tube between the closed sites is formed into an annular shape by fire processing. Next, the lead wires are allowed to pass through a hole provided in the sub-heater supporting column 33, and both ends of the lower cap heater and the sub-heater supporting column 33 are welded so as to close the hole. Finally, the lead wire is covered with an insulating tube such as alumina. The insulating tube may be inserted from the sub-heater supporting column 33.

Note that, a krypton gas or the like may also be enclosed in the quartz tube of the lower cap heater 35, and in this case, an end of a sealed portion protrudes to the inside of the annular shape. In addition, spacers for preventing contact with the quartz tube may be mounted on the filament at predetermined intervals. The upper cap heater 34 of this example includes a thermocouple for temperature detection, but this may also be provided in the lower cap heater 35.

Figure 4:
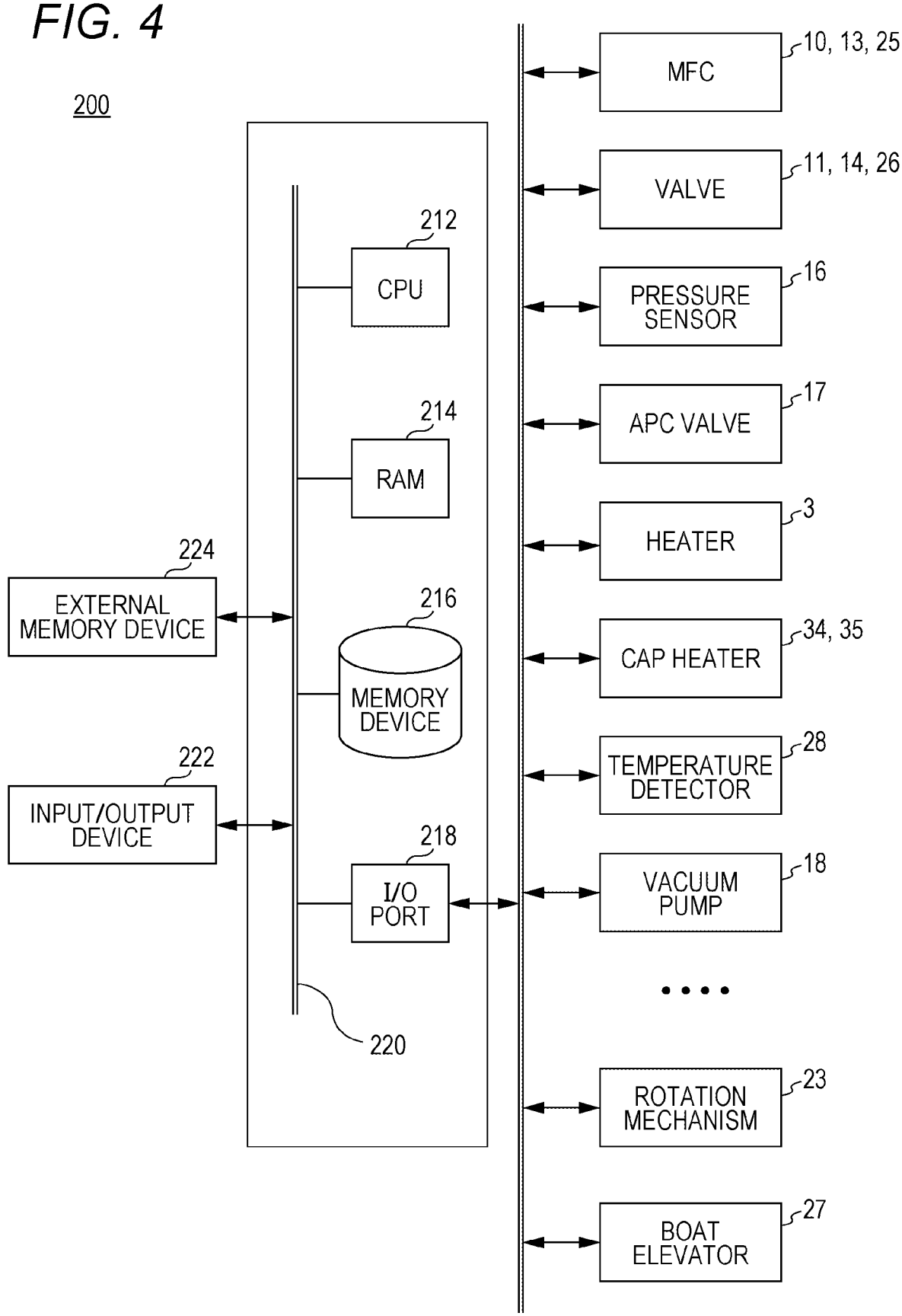
FIG. 4 is a block diagram of a controller in the substrate processing apparatus of the embodiment.

As illustrated in FIG. 4, the controller 29 is electrically connected to configurations such as the MFCs 10, 13 and 25, the valves 11, 14, and 26, the pressure sensor 16, the APC valve 17, the vacuum pump 18, the heater 3, the upper cap heater 34, the lower cap heater 35, the temperature detector 28, the rotation mechanism 23, and the boat elevator 27 to automatically control them. The controller 29 is configured as a computer provided with a central processing unit (CPU) 212, a random access memory (RAM) 214, a memory device 216, and an I/O port 218. The RAM 214, the memory device 216, and the I/O port 218 are configured to be able to exchange data with the CPU 212 via an internal bus 220. The I/O port 218 is connected to each configuration described above. For example, an input/output device 222 such as a touch panel is connected to the controller 29.

The memory device 216 includes, for example, a flash memory, a hard disk drive (HDD) and the like. In the memory device 216, a control program for controlling operation of the substrate processing apparatus 1 and a program for allowing each configuration of the substrate processing apparatus 1 to execute a film forming process and the like according to a processing condition (recipes such as a process recipe and a cleaning recipe) are stored in a readable manner. The RAM 214 is formed as a memory area (work area) in which programs and data read out by the CPU 212 are temporarily stored.

The CPU 212 reads out the control program from the memory device 216 to execute, and reads out the recipe from the memory device 216 in response to an input of an operation command from the input/output device 222 to control each configuration along the recipe.

The controller 29 may be configured by installing the above-described program continuously stored in an external memory device (for example, a semiconductor memory such as a USB memory or a memory card, an optical disk such as a CD or a DVD, and an HDD) 224 in a computer. The memory device 216 and the external memory device 224 are configured as a computer-readable tangible medium. Hereinafter, they are collectively referred to simply as a recording medium. Note that, the program may be provided to the computer by using a communication means such as the Internet or a dedicated line without using the external memory device 224.

Figure 5:
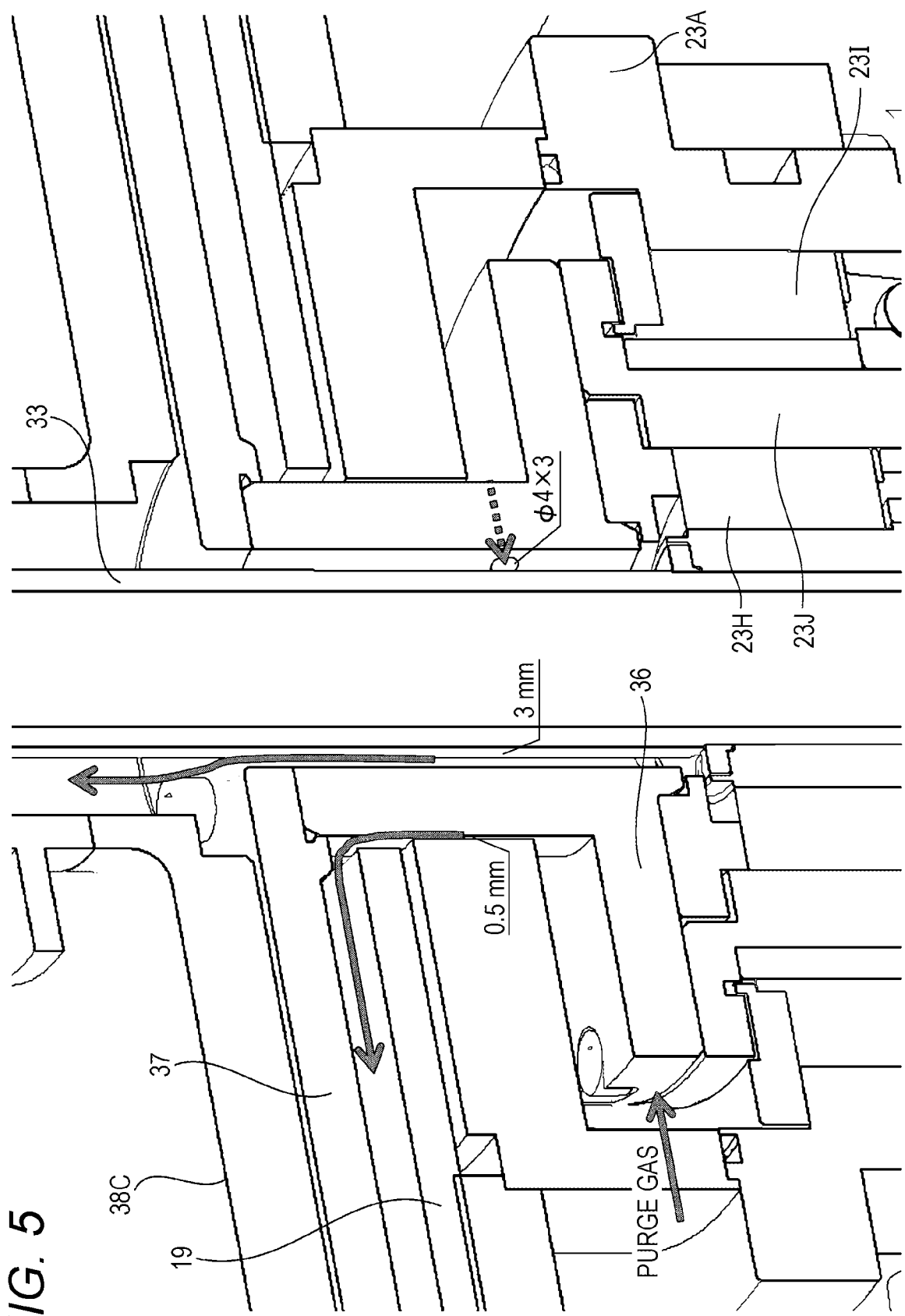
FIG. 5 is a cross-sectional perspective view of a rotary shaft and its periphery in the substrate processing apparatus of the embodiment.
Figure 6:
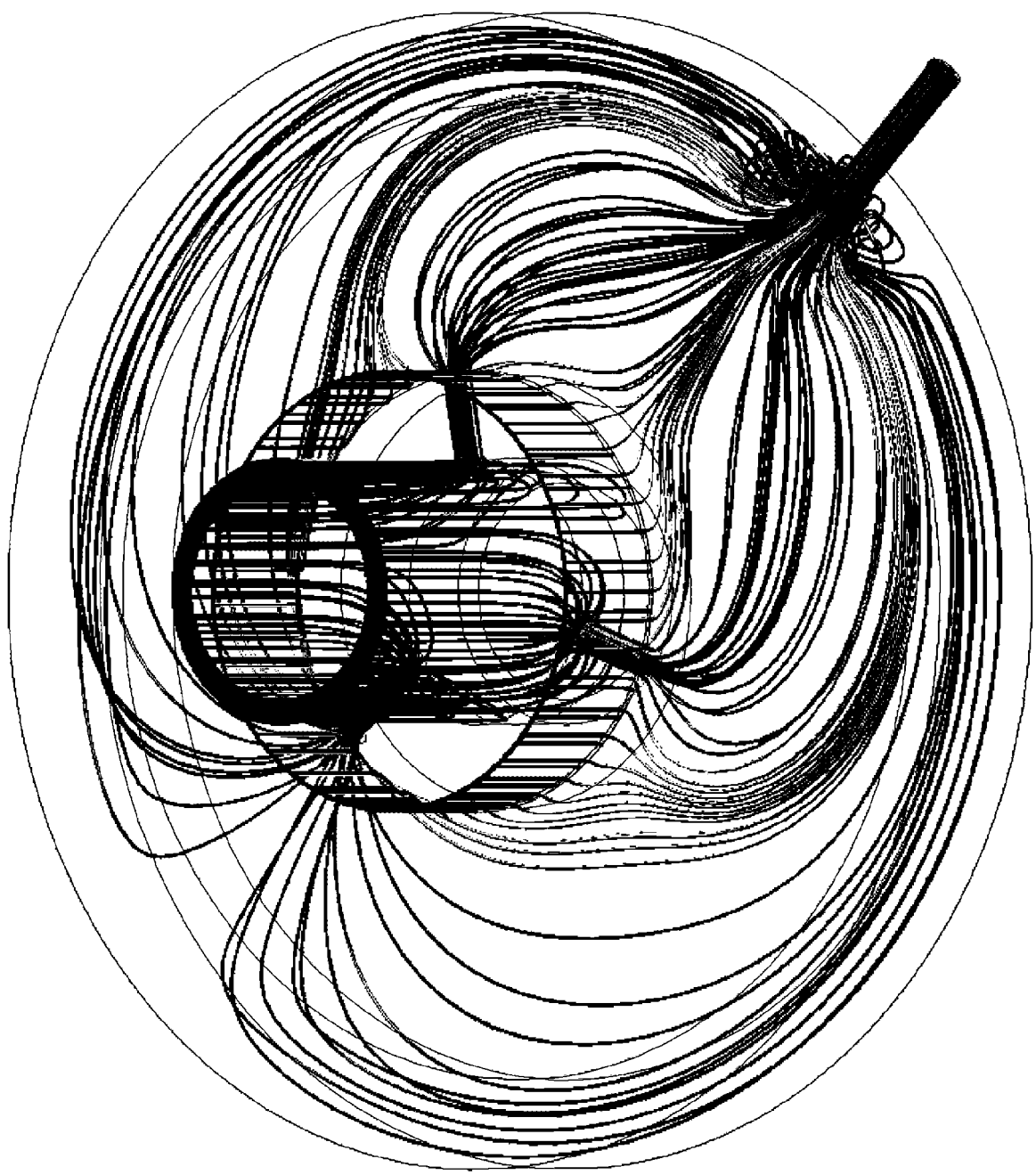
FIG. 6 is a view illustrating a flow of a purge gas in the rotary shaft and its periphery.

FIG. 5 illustrates the structure of the rotary shaft 36 and its periphery. The rotary shaft 36 has three through-holes 36A having a diameter of 4 mm on a side portion inside the casing 23A, and the through-holes allow communication between the outside of the rotary shaft 36 and an internal cavity. The casing 23A includes a purge gas introduction port on its upper side, and the purge gas from the introduction port fills a space surrounded by the casing 23A, the magnetic fluid seal 23H and the like. A part of the purge gas flows from the through-hole 36A into the cavity inside the rotary shaft 36, and flows upward through a gap (first gap) of 3 mm between the inner surface of the rotary shaft 36 and the sub-heater supporting column to flow into the heat insulating assembly 22. Then, this sequentially purges the cavity of the heat insulator holder 38 including the periphery of the lower cap heater 35 and the inner upper and lower sides of the cylindrical portion 39 according to the first and second flow paths described above to flow out from the exhaust hole 37A. In contrast, the remaining purge gas flows upward through a gap (second gap) of 0.5 mm between the rotary shaft 36 and the casing 23A (or the seal cap 19), and after hitting the rotating table 37, this purges a space between the rotating table 37 and the cover plate 20. This is referred to as a third flow path. A ratio of the flow rates between the first and third flow paths may be almost defined by conductance of the through-hole 36A, the first gap, and the second gap, and is set to about 9:1 in this example. FIG. 6 illustrates a simulation result.

Next, a sequence example of a process of forming a film on a substrate (hereinafter also referred to as a film forming process) is described as one of semiconductor device (device) manufacturing steps using the processing apparatus 4 described above.

Here, an example in which two or more nozzles 8 are provided, a hexachlorodisilane (HCDS) gas as a first process gas (source gas) is supplied from a nozzle 8A, an ammonia (NH$_3$) gas as a second process gas (reactive gas) is supplied from a nozzle 8B, and a silicon nitride (SiN) film is formed on the wafer 7 is described. Note that, in the following description, operation of each configuration of the substrate processing apparatus 1 is controlled by the controller 29.

In the film forming process in this embodiment, a step of supplying the HCDS gas to the wafer 7 in the process chamber 6, a step of removing the HCDS gas (residual gas) from the inside of the process chamber 6, a step of supplying the NH$_3$ gas to the wafer 7 in the process chamber 6, and a step of removing the NH$_3$ gas (residual gas) from the inside of the process chamber 6 are repeated a predetermined number of times (one or more times), thereby forming the SiN film on the wafer 7. In this specification, the film formation sequence is conventionally expressed as follows:

(HCDS→NH$_3$)×$n$=>SiN (Wafer charge and boat load) When a plurality of wafers 7 is loaded on the boat 21 (wafer charge), the boat 21 is loaded into the process chamber 6 (boat load) by the boat elevator 27. At that time, the seal cap 19 is in a state of airtightly closing (sealing) the lower end of the manifold 5 via the O-ring 19A. From a standby state before the wafer charge, the valve 26 is opened, and a small amount of purge gas might be supplied into the cylindrical portion 39.

(Pressure adjustment) Vacuum exhaust (depressurization exhaust) is performed by the vacuum pump 18 so that the inside of the process chamber 6, that is, a space where the wafer 7 is present is at a predetermined pressure (degree of vacuum). At that time, the pressure in the process chamber 6 is measured by a pressure sensor 52, and the APC valve 17 is feedback-controlled based on measured pressure information. The purge gas supply into the cylindrical portion 39 and the operation of the vacuum pump 18 are maintained at least until the process on the wafer 7 is finished.

(Temperature elevation) After oxygen or the like is sufficiently exhausted from the inside of the process chamber 6, the temperature elevation in the process chamber 6 is started. Based on the temperature information detected by the temperature detector 28, the degree of energization to the heater 34, the upper cap heater 34, and the lower cap heater 35 is feedback-controlled so that the process chamber 6 has predetermined temperature distribution suitable for film formation. Heating in the process chamber 6 by the heater 34 and the like is continuously performed at least until the process (film formation) on the wafer 7 is finished. An energization period to the upper cap heater 34 and the lower cap heater 35 need not coincide with a heating period by the heater 34. For example, the lower cap heater 35 may be energized before the temperature elevation by the heater 34 starts to preheat the manifold 5 and the seal cap 19, thereby promoting degassing, or this may be energized after the temperature in the process chamber 6 approaches predetermined temperature (that is, from the middle of a heatup time). Immediately before the film formation is started, it is desired that the temperature of the upper cap heater 34 reaches the same temperature as film formation temperature, and inner surface temperature of the manifold 5 reaches 180° C. or higher (for example, 260° C.). When the heating is performed immediately before, a time in which the O-ring 19A is exposed to high temperature is shortened, and a lifetime thereof may be extended.

Rotation of the boat 21 and the wafer 7 by the rotation mechanism 23 is started. The boat 21 is rotated by the rotation mechanism 23 via the rotary shaft 66, the rotating table 37, and the cylindrical portion 39, so that the wafer 7 is rotated without rotating the sub-heater 64. As a result, uneven heating is reduced. The rotation of the boat 21 and the wafer 7 by the rotation mechanism 23 is continuously performed at least until the processing on the wafer 7 is finished.

(Film formation) When the temperature in the process chamber 6 is stabilized at preset processing temperature, steps 1 to 4 are repeatedly executed. Note that, before starting step 1, the valve 26 may be opened to increase the supply of the purge gas.

[Step 1: Source Gas Supplying Step]

At step 1, the HCDS gas is supplied to the wafer 7 in the process chamber 6. At the same time as opening a valve 11A, a valve 14A is opened to flow the HCDS gas into the gas supply pipe 9 and flow a $N_2$ gas into the gas supply pipe 12. Flow rates of the HCDS gas and the $N_2$ gas are adjusted by the MFCs 10 and 13, respectively, they are supplied into the process chamber 6 through the nozzle 8, and exhausted from the exhaust pipe 15. By supplying the HCDS gas to the wafer 7, for example, a silicon (Si) containing film having a thickness of less than one atomic layer to several atomic layers is formed, for example, as a first layer on an outermost surface of the wafer 7.

[Step 2: Source Gas Exhausting Process]

After the first layer is formed, the valve 11A is closed and the supply of the HCDS gas is stopped. At that time, the APC valve 17 is kept open, the inside of the process chamber 6 is vacuum exhausted by the vacuum pump 18, and unreacted HCDS gas or the HCDS gas after contributing to the formation of the first layer remaining in the process chamber 6 is exhausted from the process chamber 6. Further, with the valve 14A kept open, the supplied $N_2$ gas purges the gas supply pipe 9, the nozzle 8, and the process chamber 6.

[Step 3: Reactive Gas Supplying Step]

At step 3, the $NH_3$ gas is supplied to the wafer 7 in the process chamber 6. Opening/closing control of valves 11B and 14B is performed by a procedure similar to that of the opening/closing control of the valves 11A and 14A at step 1. Flow rates of the $NH_3$ gas and the $N_2$ gas are adjusted by the MFCs 10 and 13, respectively, they are supplied into the process chamber 6 through the nozzle 8, and exhausted from the exhaust pipe 15. The $NH_3$ gas supplied to the wafer 7 reacts with at least a part of the first layer formed on the wafer 7 at step 1, that is, the Si-containing layer. As a result, the first layer is nitrided and changed (modified) into a second layer containing Si and N, that is, a silicon nitride layer (SiN layer).

[Step 4: Reactive Gas Exhausting Process]

After the second layer is formed, the valve 11 is closed and the supply of the $NH_3$ gas is stopped. Then, an unreacted $NH_3$ gas or the $NH_3$ gas after contributing to the formation of the second layer and reaction by-products remaining in the process chamber 6 are exhausted from the process chamber 6 by a procedure similar to that at step 1.

A SiN film having a predetermined composition and a predetermined thickness of film may be formed on the wafer 7 by performing the above-described four steps non-simultaneously, that is, a predetermined number of cycles (n times) without overlapping. Note that, the above-described cycle is preferably repeated a plurality of times.

As processing conditions of the above-described sequence, for example, processing temperature (wafer temperature): 250 to 700° C., processing pressure (pressure in processing chamber): 1 to 4000 Pa, HCDS gas supply flow rate: 1 to 2000 sccm, $NH_3$ gas supply flow rate: 100 to 10000 sccm, $N_2$ gas supply flow rate (nozzle): 100 to 10000 sccm, and $N_2$ gas supply flow rate (rotary shaft): 100 to 500 sccm, are exemplified. By setting each processing condition to a certain value within each range, the film forming process may be appropriately advanced.

There is a case where a pyrolytic gas such as HCDS forms a by-product film on a metallic surface more easily than on a quartz surface. On a surface exposed to HCDS (and ammonia), SiO, SiON and the like are likely to adhere particularly when the temperature is 260° C. or lower.

(Purge and return to atmospheric pressure) After the film forming process is completed, the valves 14A and 14B are opened, and the $N_2$ gas is supplied into the process chamber 6 from the gas supply pipes 12A and 12B to be exhausted from the exhaust pipe 15. As a result, the atmosphere in the process chamber 6 is replaced with an inert gas (inert gas replacement), and remaining sources and by-products are removed (purged) from the process chamber 6. Thereafter, the APC valve 17 is closed, and $N_2$ gas is filled until the pressure in the process chamber 6 reaches normal pressure (return to atmospheric pressure).

(Boat unload and wafer discharge) The seal cap 19 is lowered by the boat elevator 27, and the lower end of the manifold 5 is opened. Then, the processed wafer 7 is unloaded out of the reaction tube 4 from the lower end of the manifold 5 in a state of being supported by the boat 21 (boat unload). The processed wafer 7 is taken out from the boat 21.

There is a case where the pyrolytic gas such as HCDS forms a film on the metallic surface more easily than on the quartz surface. On a surface exposed to HCDS (and ammonia), SiO, SiON and the like are likely to adhere particularly when the temperature is 260° C. or lower.

In this embodiment, one or a plurality of effects described below may be obtained. (a) The purge gas supplied from the gas supply pipe 24 and flowing radially between the seal cap 19 and the cylindrical portion 39 purges the vicinity of the manifold 5, thereby strongly preventing the adhesion of the by-products to the manifold 5.

(b) By allowing the purge gas to flow through the cylindrical portion 39, it is possible to prevent adhesion of the by-products and corrosion in the cylindrical portion 39. As a result, emissivity and reflectivity of the surfaces of the upper cap heater 34, the lower cap heater 35, and the heat insulator 40 are maintained, and the performance of heating and heat insulation may be maintained.

(c) The upper cap heater 34 and the lower cap heater 35 may heat sites where the temperature is difficult to elevate such as a bottom wafer, thereby reducing a recovery time.

(d) Since a calorific value of the lower cap heater 35 may be arbitrarily adjusted, the temperature in the vicinity of the furnace opening may be locally equal to or higher than the processing temperature in some cases. By doing so, the source gas supplied from the inlet may be preheated around the furnace opening or at a nozzle base, which is effective when decreasing a difference in temperature of the gas supplied to each wafer 7 in a case where the flow rate becomes particularly large.

Figure 7:
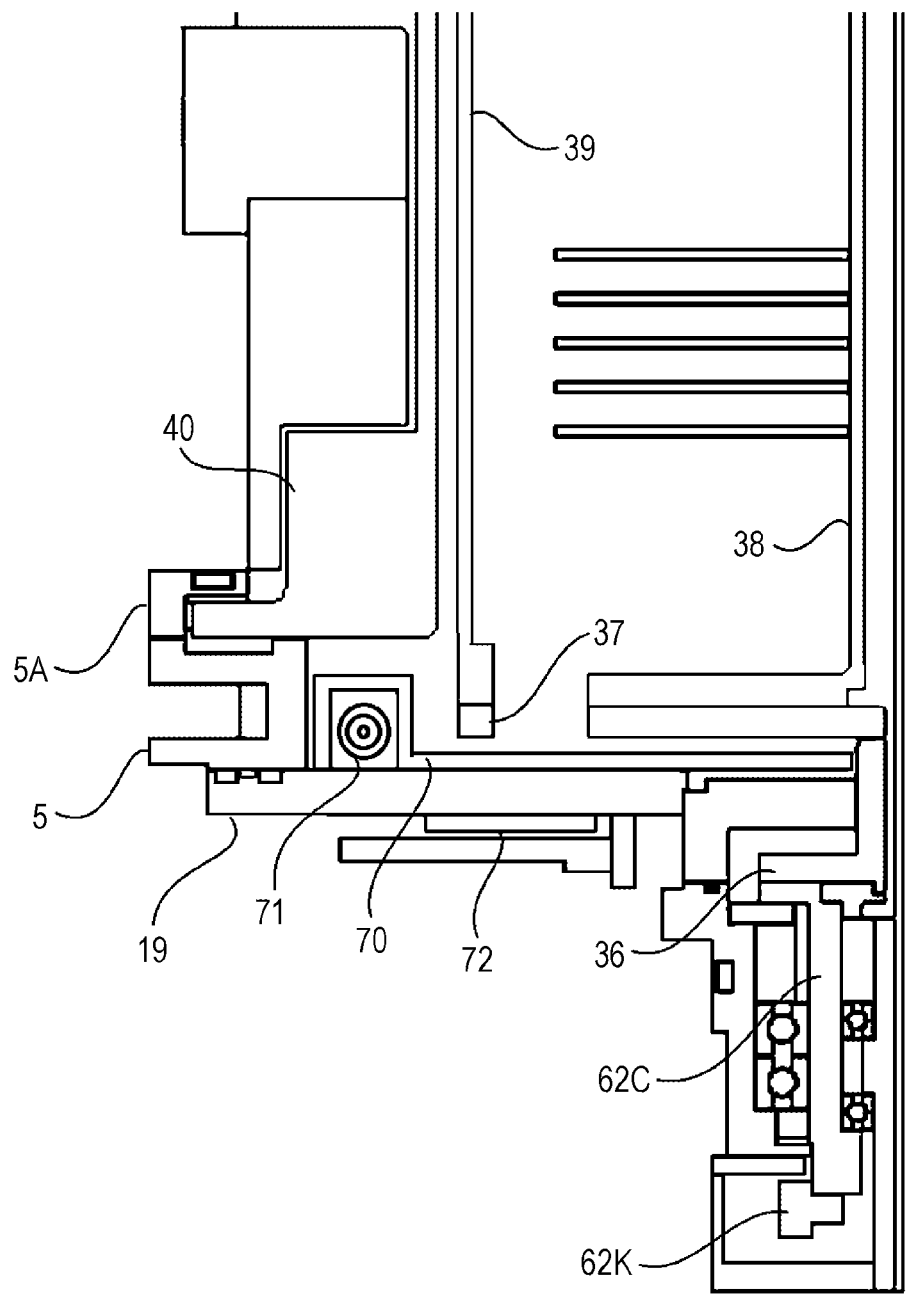
FIG. 7 is a longitudinal section of a heat insulating assembly in a modified embodiment.

Next, a modified example of the above-described embodiment is described. FIG. 7 illustrates a longitudinal section of a heat insulating assembly of a substrate processing apparatus according to the modified embodiment. Note that, a right half is not illustrated because this is bilaterally symmetric. In this example, in place of the lower cap heater 35, a lower cap heater 71 is provided which is arranged in a position closer to a manifold.

The lower cap heater 71 includes a torus-shaped heat generator independent of a sub-heater supporting column 33, and a cylindrical supporting column having the same diameter extending downward from one site of the heat generator. A diameter of the torus is larger than that of a heat insulating assembly 22. The supporting column penetrates through a seal cap 19 to extend out of a process chamber 6, and a lead wire of the lower cap heater 71 is taken out from a lower end thereof. A space between the supporting column and the seal cap 19 is sealed by a joint similar to a vacuum joint 23P.

A cover plate 70 corresponds to a cover plate 20 on which a bulge is formed so as to accommodate the lower cap heater 71 in the vicinity of an edge thereof.

Note that, a heat generator of the lower cap heater 71 is not limited to a loop shaped one, and may be a C-shaped one divided at a base of a nozzle 8 and provided with supporting columns at both ends thereof. Alternatively, this may also be formed integrally with the cover plate 70.

In the modified example, a lid jacket heater 72 and a water jacket 5A are additionally provided. The lid jacket heater 72 is arranged in contact with an outer surface of the seal cap 19 to heat the seal cap 19. The water jacket 5A is fastened together with the manifold 5 so as to sandwich a flange of a reaction tube 4, and transfers heat transferred from the flange to cooling water flowing therethrough, so that an O-ring 19A and the like of the manifold 5 is prevented from becoming too hot.

According to this modified example, an inner surface of the manifold 5 may be efficiently heated by the lower cap heater 71 arranged closer to the manifold. Since the cover plate 70 faces the inner surface of the manifold 5 with a narrow gap therebetween, exposure to gas may be reduced. This effect is enhanced in particular when the gap is purged with an inert gas. In this modified example also, the lower cap heater is surrounded by quartz of a seal cap plate, and has a structure which avoids direct contact with the source gas. Since the surface of the lower cap heater 71 might be particularly hot, another undesirable decomposition or deposition might occur when the source gas touches there.

By installing the lower cap heater as described above, a metallic member around the furnace opening may be heated, and adhesion of by-products may be suppressed.

In the above-described embodiment, the example in which the film is deposited on the wafer 7 is described. However, this present disclosure is not limited to such a mode; for example, this may also be applied in a case where the wafer 7 or the film formed on the wafer 7 is subjected to treatment such as oxidizing, diffusing, annealing, and etching.

INDUSTRIAL APPLICABILITY

This present disclosure may be suitably applied to formation of films used for semiconductor devices and other processes.

According to this present disclosure, it is possible to shorten the heatup time in the processing chamber and to prevent the adhesion of the by-products.

What is claimed is:
1. A substrate processing apparatus comprising:
a process chamber in which a substrate is processed;
a substrate holder boat that holds the substrate in the process chamber;
a process gas supply pipe that supplies a process gas into the process chamber;
a first heater that is installed outside the process chamber and heats an inside of the process chamber;
a heat insulating assembly that is installed between a seal cap of the process chamber and the substrate holder boat;
a second heater that is installed near the substrate holder boat in the heat insulating assembly and heats the inside of the process chamber;
a third heater that is installed near an end closer to the seal cap in the process chamber and heats the end; and
a purge gas supplier that supplies a purge gas into the heat insulating assembly to purge around the second and third heaters
wherein the second heater is formed to have a smaller diameter than a diameter of any of the third heater and the substrate and is held by a supporting column on an upper portion of the heater insulating assembly;
wherein the third heater is formed into a torus shape and is provided at substantially the same height as the manifold so as to face an inner surface of the manifold, and
wherein the second and third heaters share a single casing formed continuously and integrally.

2. The substrate processing apparatus according to claim 1,
wherein the heat insulating assembly is provided with:
a cylinder that is formed into a cylindrical shape with an upper end closed on an upper surface of which the substrate holder boat is placed;
a heat insulator holder arranged in the cylindrical portion along a central axis; and
a rotating table that supports the cylinder and the heat insulator holder, and
the third heater is provided in a space between the rotating table and the heat insulator holder.

3. The substrate processing apparatus according to claim 2,
wherein the space is purged with the purge gas, and
the heat insulating assembly includes a hole for exhausting the purge gas in the cylinder into the process chamber.

4. The substrate processing apparatus according to claim 3,
wherein the process chamber includes a cylindrical metallic manifold provided with a plurality of inlets for introducing a gas at a connection with the seal cap, and the third heater is formed into a torus shape and is provided at the same height as the manifold so as to face an inner surface of the manifold.

5. The substrate process apparatus according to claim 4, wherein the second heater is formed into a torus shape having a smaller diameter than a diameter of any of the third heater and the substrate, and is installed in an upper portion of the heat insulating assembly.

6. The substrate processing apparatus according to claim 2, further comprising:
 a supporting column that penetrates through the seal cap, the cradle, and the heat insulator holder to extend and holds the second heater at an upper end; and
 a cover plate of a corrosion resistant provided on an inner surface of the seal cap, wherein
 the second heater is formed into a torus shape having a smaller diameter than a diameter of any of the third heater and the substrate and is fixed so as not to be separated from the supporting column, and
 the third heater is provided in a space between the seal cap and the cover plate outside the heat insulating assembly and the space is purged by the purge gas.

7. The substrate processing apparatus according to claim 1,
 wherein the process chamber includes a cylindrical metallic manifold provided with a plurality of inlets for introducing a gas at a connection with the seal cap.

8. The substrate processing apparatus according to claim 7, wherein each of the second and third heaters includes a lead wire, and the lead wire passes through an inside of the supporting column provided so as to penetrate the seal cap to independently extend out of the process chamber.

9. A substrate processing apparatus comprising:
 a processing chamber in which a substrate is processed;
 a substrate holder boat that holds the substrate in the process chamber;
 a process gas supply pipe that supplies a process gas into the process chamber;
 a first heater that is installed outside the process chamber and heats an inside of the process chamber;
 a heat insulator assembly that is installed between a seal cap of the process chamber and the substrate holder boat;
 a second heater that is installed near the substrate holder boat in the heat insulating assembly and heats the inside of the process chamber;
 a third heater that is installed near an end closer to the seal cap in the process chamber and heats the end; and
 a purge gas suppler that supplies a purge gas into the heat insulating assembly to purge around the second and third heaters, and
 a cover plate that is formed of a heat and corrosion resistant material into a disk shape and installed on the seal cap,
 the cover plate includes a bulge that is formed near an edge of the cover plate to accommodate the third heater between the seal cap and the cover plate,
 wherein the second heater is formed to have a smaller diameter than a diameter of any of the third heater and the substrate and is held by a supporting column on an upper portion of the heat insulating assembly,
 wherein the third heater includes a torus-shaped heat generator having a diameter larger than a diameter of the heat insulating assembly and provided at substantially the same height as the manifold so as to face an inner surface of the manifold, and a supporting column extending downward from the heat generator.

* * * * *